(12) United States Patent
Tao et al.

(10) Patent No.: US 11,086,529 B2
(45) Date of Patent: Aug. 10, 2021

(54) DATA STORAGE SYSTEMS AND METHODS FOR IMPROVED DATA RELOCATION BASED ON READ-LEVEL VOLTAGES ASSOCIATED WITH ERROR RECOVERY

(71) Applicant: Western Digital Technologies, Inc., San Jose, CA (US)

(72) Inventors: Jun Tao, Ladera Ranch, CA (US); Niang-Chu Chen, Irvine, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/143,242

(22) Filed: Sep. 26, 2018

(65) Prior Publication Data

US 2020/0097189 A1    Mar. 26, 2020

(51) Int. Cl.
*G06F 3/06* (2006.01)
*G11C 16/26* (2006.01)
*G11C 16/34* (2006.01)
*G11C 16/04* (2006.01)

(52) U.S. Cl.
CPC .......... *G06F 3/0619* (2013.01); *G06F 3/0659* (2013.01); *G06F 3/0679* (2013.01); *G11C 16/26* (2013.01); *G11C 16/349* (2013.01); *G11C 16/0408* (2013.01)

(58) Field of Classification Search
CPC .... G06F 3/0619; G06F 3/0659; G06F 3/0679; G11C 16/26; G11C 16/349; G11C 16/0408
See application file for complete search history.

(56) References Cited

U.S. PATENT DOCUMENTS

| | | | | |
|---|---|---|---|---|
| 8,621,266 B2* | 12/2013 | Kang | ............ | G06F 11/1068 714/6.11 |
| 8,675,414 B1* | 3/2014 | Yang | ............ | G11C 11/5642 365/185.2 |
| 9,218,881 B2* | 12/2015 | Yang | ............ | G11C 16/0483 |
| 9,397,918 B2* | 7/2016 | Edsall | ............ | H04L 43/0882 |
| 9,620,226 B1* | 4/2017 | Main | ............ | G11C 16/08 |
| 9,620,266 B2* | 4/2017 | Ortner | ............ | H01G 4/232 |
| 9,633,740 B1* | 4/2017 | Alhussien | ............ | G11C 16/28 |
| 9,846,544 B1* | 12/2017 | Bassov | ............ | G06F 3/0665 |
| 9,870,830 B1* | 1/2018 | Jeon | ............ | G11C 16/3459 |
| 2010/0157671 A1* | 6/2010 | Mokhlesi | ............ | G11C 16/3418 365/185.03 |

(Continued)

*Primary Examiner* — Prasith Thammavong
*Assistant Examiner* — Richard L Sutton
(74) *Attorney, Agent, or Firm* — Morgan, Lewis & Bockius LLP

(57) ABSTRACT

Apparatus, media, methods, and systems are disclosed for improved data relocation based on read-level voltages. A data storage system may include a non-volatile memory device including a source region and a destination region. The destination region may include a first destination block and a second destination block. A controller may read first data in the source region using a first read-level voltage, and read second data in the source region using a second read-level voltage. The controller may associate, based on the first and second read-level voltages, each of the first data and the second data with a respective one of the first and the second destination blocks. The controller may cause each of the first and second data to be stored in the associated one of the first and second destination blocks.

16 Claims, 5 Drawing Sheets

(56) References Cited

U.S. PATENT DOCUMENTS

| | | | |
|---|---|---|---|
| 2011/0007563 A1* | 1/2011 | Yoo | G11C 11/5642 365/185.03 |
| 2011/0264843 A1* | 10/2011 | Haines | G06F 3/0616 711/103 |
| 2011/0320688 A1* | 12/2011 | Lee | G06F 12/0246 711/103 |
| 2013/0145079 A1* | 6/2013 | Lee | G06F 12/0246 711/103 |
| 2014/0215133 A1* | 7/2014 | Seo | G06F 12/0246 711/103 |
| 2016/0124642 A1* | 5/2016 | Kim | G06F 3/0673 711/156 |
| 2016/0125922 A1* | 5/2016 | Chen | G11C 16/10 365/189.16 |
| 2016/0147582 A1* | 5/2016 | Karakulak | G06F 11/073 714/37 |
| 2017/0206023 A1* | 7/2017 | Motwani | G06F 3/0611 |
| 2017/0285971 A1* | 10/2017 | Dai | G06F 12/0246 |

* cited by examiner

DATA STORAGE SYSTEMS AND METHODS FOR IMPROVED DATA RELOCATION BASED ON READ-LEVEL VOLTAGES ASSOCIATED WITH ERROR RECOVERY

BACKGROUND

Data storage systems may need to periodically relocate data from one location to another location. All of the data that is being relocated may not be accessed at the same frequency. For example, certain data may be accessed more frequently than other data, while certain other data may not be accessed for an extended period of time. Every time stored data is accessed, the data storage system applies a certain voltage to the wordline storing the data. As the data is accessed more frequently, the read-level voltage required to successfully read and/or decode the data increases. Similarly, when data is not accessed for an extensive period of time, the read-level voltage required to successfully read and/or decode the data decreases. The change in the read-level voltages required to successfully read and/or decode the data may increase the error rates when accessing the data, which increases the computation cost and processing time to successfully perform read operations by the data storage system.

The description provided in the background section should not be assumed to be prior art merely because it is mentioned in or associated with the background section. The background section may include information that describes one or more aspects of the subject technology.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various configurations of the subject disclosure and is not intended to represent the only configurations in which the subject disclosure may be practiced. The appended drawings are incorporated herein and constitute a part of the detailed description. The detailed description includes specific details for the purpose of providing a thorough understanding of the subject disclosure. However, it will be apparent to those skilled in the art that the subject disclosure may be practiced without these specific details. In some instances, structures and components are shown in block diagram form in order to avoid obscuring the concepts of the subject disclosure. Like components are labeled with identical element numbers for ease of understanding.

Figure 1:
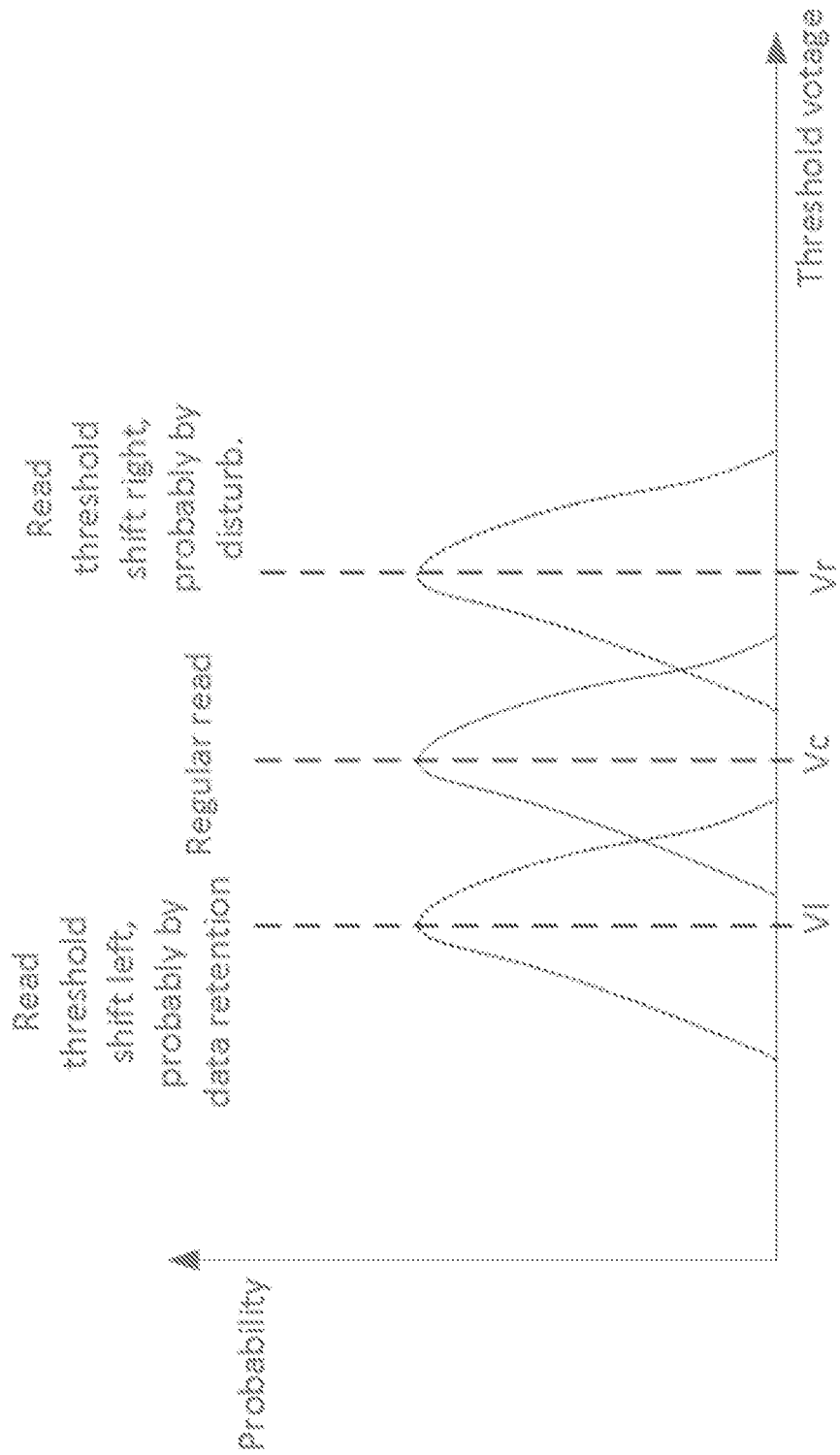
FIG. 1 depicts an example graph diagram illustrating three possible scenarios for a read-level voltage according to illustrative implementations.

The present description relates in general to data storage systems, and more particularly to, for example, and without limitation, data storage systems and methods for data relocations based on error recovery. A read-level voltage is applied to the wordline to read data from the wordline in a non-volatile memory. Application of read-level voltage to the wordline may impact neighboring or adjacent wordlines. For example, electrons of the neighboring or adjacent wordlines may get injected into the floating gate of the wordline that is being read, thereby, the charge of wordline that is being read will be changed, causing a read disturb effect. Due to the larger number of electrons, the read-level voltage required to accurately perform the read operation on the wordline may be shifted to the right of or is greater than the default or initial read-level voltage, as shown in FIG. 1. The more frequently the data is read, the more likely voltage required to successfully read or decode the data is greater than the default or initial read-level voltage. Performance and efficiency of the data storage system is improved if such data is stored in a block with a low program-erase cycle count. In some implementations, a program-erase cycle count of a block is determined to be a low program-erase cycle count if the program-erase cycle count of the block satisfies or is less than or equal to a threshold program-erase cycle count.

Similarly, when stored data is not accessed for a long period of time, then issues arise with the retention of that data. For example, when data is not accessed or read for a long period of time, then some of electrons stored in the floating gate of the wordline, which represent the data values that are stored, may escape from the floating gate, thus causing issues with retention of data. The loss of electrons affects the appropriate read-level voltage that is to be applied when reading the data. For example, a lower read-level voltage may be applied to successfully read the data from the non-volatile memory device, as shown in FIG. 1. When data is successfully read at a lower voltage than a certain default read-level voltage or a first read-level voltage, then that data is likely not being accessed as frequently as other data. The data storage system would benefit for such data to be stored in a block with a high program-erase cycle count. In some implementations, a program-erase cycle count of a block is determined to be a high program-erase cycle count if the program-erase cycle count of the block satisfies or is greater than equal to a threshold program-erase cycle count.

Figure 2:
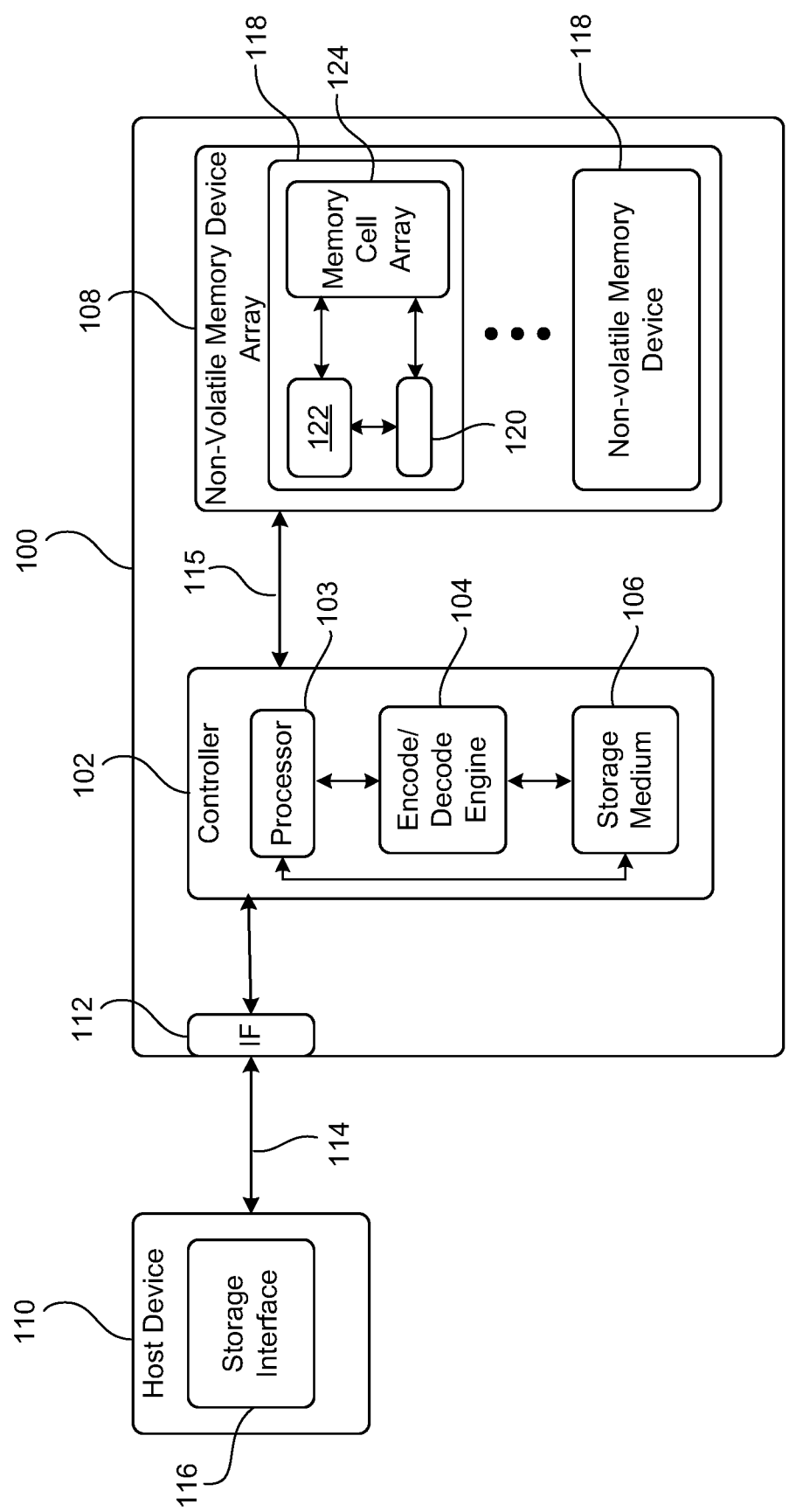
FIG. 2 is a block diagram illustrating components of a data storage system according to illustrative implementations.

FIG. 2 is a block diagram depicting example components of a data storage system 100, according to one or more aspects of the subject technology. Data storage system 100 includes, among other things, controller 102, and non-volatile memory device array 108. The controller 102 includes processor 103, encode/decode engine 104, storage medium 106. In some implementations, encode/decode engine 104 and storage medium 106 may be placed outside the controller 102. As depicted in FIG. 2, data storage system 100 may be connected to a host device 110 via host interface 112.

Controller 102 may include several internal components (not shown) such as one or more processors 103, a read-only memory, a non-volatile component interface (for example, a multiplexer to manage instruction and data transport along a connection to non-volatile memory device array 108), an I/O interface, error correction circuitry, and the like. A processor of controller 102 may monitor and control the operation of the components in data storage controller 102. The processor and/or controller 102 may be a multi-core processor, a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. In some implementations, one or more elements of controller 102 may be integrated into a single chip. In some implementations, the elements may be implemented on two or more discrete components.

Controller 102 may execute code or instructions to perform the operations and functionality described herein. For example, controller 102 may perform operations for managing request flow and address mappings, and to perform calculations and generate commands. One or more sequences of instructions may be stored as firmware on a memory within controller 102. One or more sequences of instructions may be software stored and read from storage medium 106, non-volatile memory device array 108, or received from host device 110 (for example, via host interface 112). Storage medium 106 and non-volatile memory device array 108 include examples of machine or computer readable media on which instructions/code executable by controller 102 may be stored. Machine or computer readable media may generally refer to any tangible and non-transitory medium or media used to provide instructions to controller 102, including both volatile media, such as dynamic memory used for storage media or for buffers within controller 102, and non-volatile media, such as electronic media, optical media, and magnetic media. The operations and functionality described herein also may be implemented in hardware using logic circuits, for example, or a combination of hardware and software/firmware.

Figure 3:
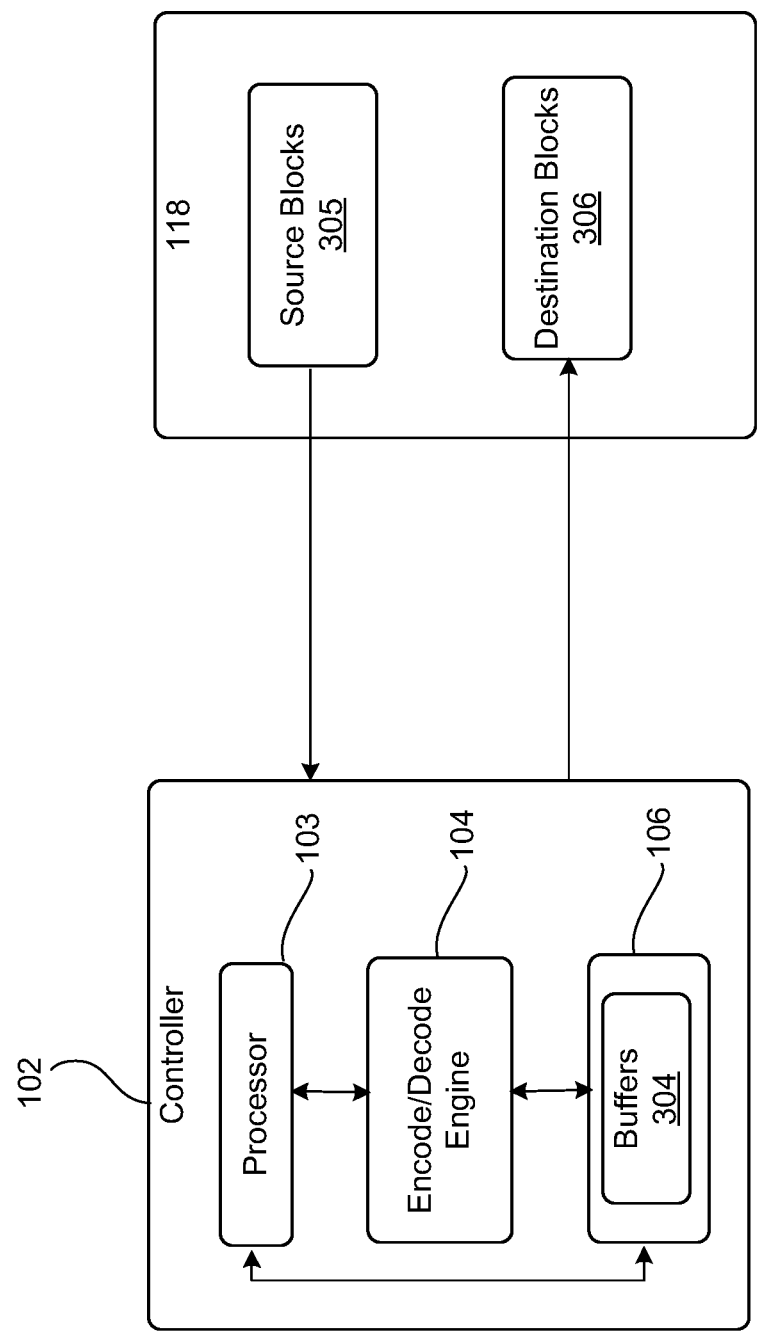
FIG. 3 is a block diagram illustrating components of a data storage system according to illustrative implementations.

In some aspects, storage medium 106 represents the volatile memory used to temporarily store data and information used to manage data storage system 100. According to aspects of the present disclosure, storage medium 106 is a random access memory (RAM) such as double data rate (DDR) RAM. Other types of RAM also may be used to implement storage medium 106. Storage medium 106 may be implemented using a single RAM module or multiple RAM modules. While storage medium 106 is depicted as being distinct from controller 102, it is understood that storage medium 106 may be incorporated into controller 102 without departing from the scope of the present disclosure. Alternatively, storage medium 106 may be a non-volatile memory such as a magnetic disk, flash memory, peripheral SSD, and the like. In some implementations, storage medium 106 may include one or more buffers, such as buffers 304, as shown in FIG. 3.

Host interface 112 may be coupled to host device 110, to receive data from and send data to host device 110. Host interface 112 may include both electrical and physical connections for operably coupling host device 110 to controller 102. Host interface 112 may communicate data, addresses, and control signals between host device 110 and controller 102. In this manner, controller 102 may store data received from host device 110 in non-volatile memory device array 108 in response to a write command from host device 110, and to read data stored in non-volatile memory device array 108 and to transfer the read data to host device 110 via host interface 112 in response to a read command from host device 110.

Host device 110 represents any device that may be coupled to data storage system 100 and to store data in data storage system 100. Host device 110 may be a computing system such as a personal computer, a server, a workstation, a laptop computer, PDA, smart phone, and the like. Alternatively, host device 110 may be an electronic device such as a digital camera, a digital audio player, a digital video recorder, and the like.

As further depicted in FIG. 2, host device 110 and data storage system 100 may be in communication with each other via a bus 114. The bus may use suitable interfaces standard including, but not limited to, serial advanced technology attachment (SATA), advanced technology attachment (ATA), small computer system interface (SCSI), PCI-extended (PCI-X), fiber channel, serial attached SCSI (SAS), secure digital (SD), embedded multi-media card (EMMC), universal flash storage (UFS) and peripheral component interconnect express (PCIe). According to some aspects, data storage system 100 may include pins (or a socket) to mate with a corresponding socket (or pins) on host device 110 to establish an electrical and physical connection.

Controller may include an internal system bus 115. System bus 115 may include a combination of a control bus, address bus, and data bus, and connect the components of controller 102 (e.g., a processor and/or memory therein) with other components of data storage system 100, including encode/decode engine 104, storage medium 106, non-volatile memory device array 108, and host interface 112. Data is transferred between the various components over system bus 115. System bus 115 may reside partially external and partially internal to controller 102.

Host device 110 and data storage system 100 may be in communication with each other via a wired or wireless connection and may be local to or remote from one another. According to one or more other aspects, data storage system 100 (or host interface 112) includes a wireless transceiver to place host device 110 and data storage system 100 in wireless communication with each other.

Controller 102 may receive data and/or storage access commands from a storage interface module 116 (e.g., a device driver) of host device 110. Storage access commands communicated by the storage interface module 116 may include read and write commands issued by the host device 110. Read and write commands may specify a logical address, e.g., logical block addresses (LBAs) used to access data stored in the data storage system 100. Controller 102 may execute commands in the non-volatile memory device array 108 in response to commands received from storage interface module 116.

Non-volatile memory device array 108 may include multiple non-volatile memory devices 118. A non-volatile memory device 118 represents a non-volatile memory device for storing data. According to aspects of the subject technology, non-volatile memory device 118 includes, for example, a NAND flash memory. Each non-volatile memory device 118 may include a single non-volatile memory chip or die, or may include multiple non-volatile memory chips or die. For example, within non-volatile memory device array 108, some of the non-volatile memory devices 118 may comprise one non-volatile die while others may comprise more than one non-volatile die. Non-volatile memory device 118 is not limited to any particular capacity or configuration. For example, the number of physical blocks, the number of physical pages per physical block, the number of sectors per physical page, and the size of the sectors may vary within the scope of the subject technology.

Figure 4:
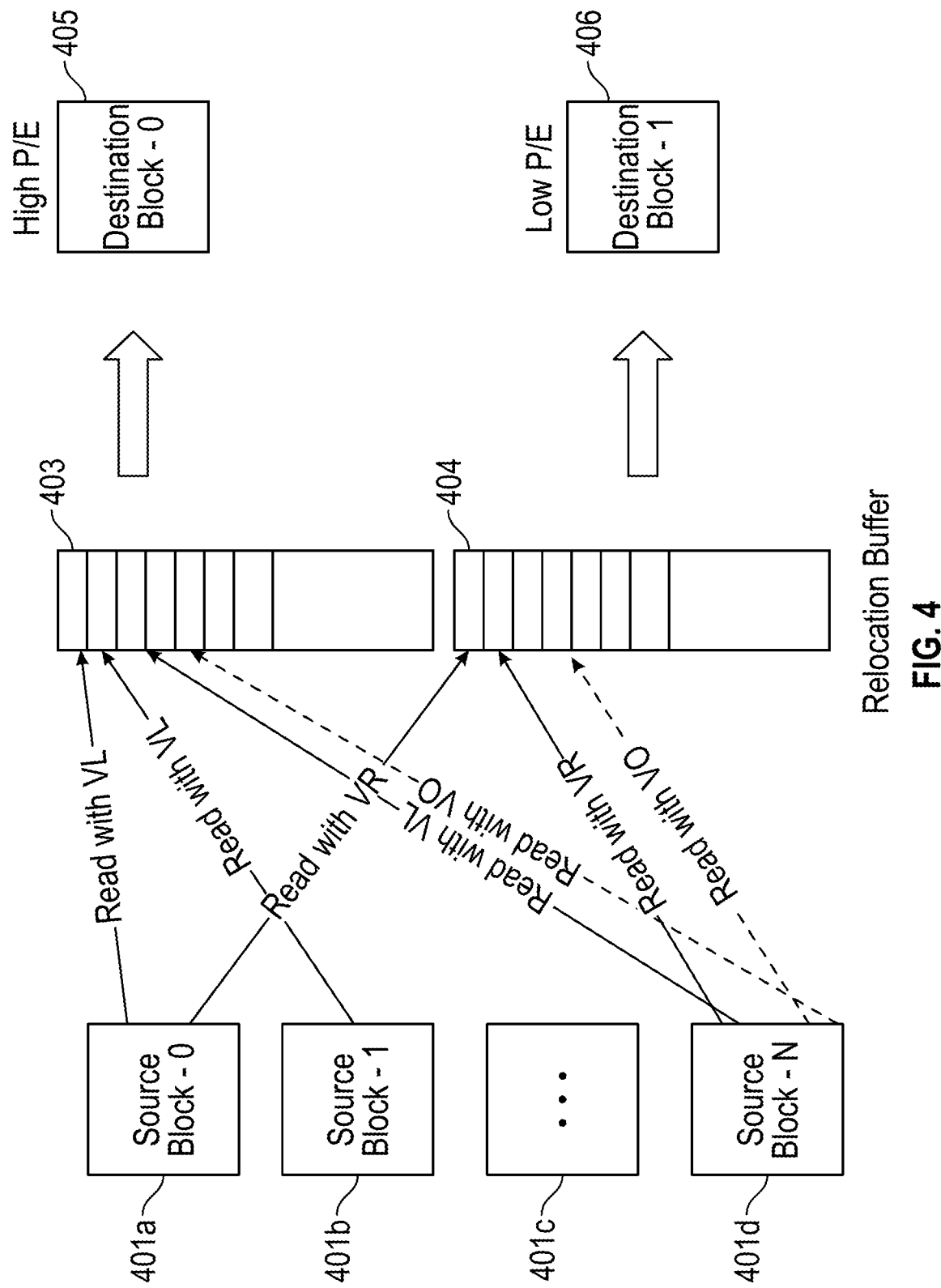
FIG. 4 is illustrates association of data from source blocks with destination blocks according to illustrative implementations.

Non-volatile memory devices 118 may be arranged in multiple channels, with each channel having one or more non-volatile memory devices 118. A non-volatile memory device 118 may include one or more non-volatile memory interfaces (not shown). Each non-volatile memory interface interfaces the controller 102 to one of the non-volatile memory devices via a corresponding channel. Each of the channels (not shown) may be implemented using one or more physical I/O buses coupled between one of the non-volatile memory interfaces and the corresponding non-volatile device(s). Each channel allows the corresponding non-volatile memory interface to send read, write and/or erase commands to the corresponding non-volatile memory device. Each non-volatile memory interface may include a register (e.g., First-In-First-Out (FIFO) register) that queues read, write and/or erase commands from the controller 102 for the corresponding non-volatile memory device. Although the term "channel," as used above, referred to the bus coupled between a non-volatile memory interface and the corresponding non-volatile memory device, the term "channel" may also refer to the corresponding non-volatile memory device that is addressable through a bus (e.g., system bus 115). Non-volatile memory devices 118 may include memory blocks. In some implementations, the memory blocks of a non-volatile memory device may be logically grouped based on certain memory device operations and/or processes, such as garbage collection, data relocation, and the like. In some implementations, some of the memory blocks may be logically grouped into source memory blocks, such as source memory blocks 305, as shown in FIG. 3. For example, as shown in FIG. 4, memory blocks 401a, 401b, 401c, 401d, may be collectively referred to as source blocks 305. In some implementations, some of the memory blocks may be logically grouped into destination memory blocks, such as destination memory blocks 306, as shown in FIG. 3. For example, as shown in FIG. 4, memory blocks 405, 406, may be collectively referred to as destination blocks 306. The controller 102 may be configured to relocate data stored in source memory blocks 305 to destination memory blocks 306 based on error correction data associated with the data stored in the source memory blocks. Additional details of the relocation of the data are described with reference to FIG. 5.

Non-volatile memory device 118 may have a standard interface specification. This standard ensures that chips from multiple manufacturers can be used interchangeably. The interface of non-volatile memory device 118 may be used to access internal registers 120 and an internal non-volatile memory controller 122. In some implementations, registers 120 may include address, command, and/or data registers, which internally retrieve and output the necessary data to and from a memory cell array 124. In some implementations, memory cell array 124 may be a NAND memory cell array. By way of example, memory cell array 124 may comprise a single-level cell (SLC) memory, a multi-level cell (MLC) memory, a three-level cell (TLC) memory, a four-level cell (QLC) memory device, etc. In some aspects, the non-volatile memory device array 108 may comprise one or more hybrid memory devices that may function in one or more of a SLC, MLC, TLC, or QLC mode. Other types of non-volatile memory such as 3D NAND flash memory also are contemplated in the subject technology.

Data register (e.g., of registers 120) may include data to be stored in memory cell array 124, or data after a fetch from memory cell array 124, and may also be used for temporary data storage and/or act like a buffer. An address register may store the memory address from which data will be fetched to host device 110 or the address to which data will be sent and stored. In some aspects, a command register is included to control parity, interrupt control, and the like. In some aspects, internal non-volatile memory controller 122 is accessible via a control register to control the general behavior of non-volatile memory device 118. Internal non-volatile controller 122 and/or the control register may control the number of stop bits, word length, receiver clock source, and may also control switching the addressing mode, paging control, co-processor control, and the like.

Encode/decode engine 104 represents one or more components that may encode and/or decode code words to be stored in and/or read from the non-volatile memory device array 108. Encode/decode engine 104 may include an encoder and a decoder. In some implementations, the encode/decode engine 104 may include one or more encoders and/or one or more decoders. The decoder may include a hard decoder and a soft-decision ECC decoder. Encode/decode engine 104 may encode data received from host device 110 and decode code words read from the non-volatile memory device 118 before sending the decoded data to the host. In some implementations, encode/decode engine 104 may comprise one or more memory devices and/or one or more processing units used to perform error correction (e.g., using LDPC, BCH, or turbo codes). Encode/decode engine 104 may also include a soft information module that determines and/or maintains soft metric inputs for encoding and decoding operations. While encode/decode engine 104 is depicted as being distinct from controller 102, it is understood that encode/decode engine 104 may be incorporated into controller 102 without departing from the scope of the present disclosure. In some implementations, the encode/decode engine 104 may be configured to transmit or provide data to the one or more processors 103 of the controller 102. Additional details of the encode/decode engine 104 are described below with reference to FIG. 5.

As described above, data can be more efficiently stored to improve efficiency and performance of the data storage system during performance of data operations, thereby improving overall efficiency and performance of the data storage system. The controller 102 may be configured to receive data in response to transferring a read operation or command at a first read-level voltage to the non-volatile memory device 118. In some implementations, a first read-level voltage may be a default read-level voltage. In some implementations, a default read-level voltage may be a predetermined for a non-volatile memory device, such as non-volatile memory device 118. As described above, the data may be stored in memory blocks in the non-volatile memory device 118, referred to as source memory blocks, such as source memory blocks 401a, 401b, 401c, 401d. The controller 102 may be configured to determine whether the received data is successfully read or decoded by the encode/decode engine 104 at the first read-level voltage.

If the controller 102 determines that the received data is not successfully read or decoded by the encode/decode engine 104 using the first read-level voltage, then the controller 102 determines a shifted read-level voltage, and transfers a read operation to the non-volatile memory device to read or retrieve data from the source block using the shifted read-level voltage. The controller 102 may be configured to determine whether the data received when using the shifted read-level voltage is successfully read or decoded using the shifted read-level voltage, and if the data is not successfully read or decoded, then, in some implementations, the controller 102 may be configured to continue to determine new shift read-level voltages until the data is successfully read or decoded or an uncorrectable error message is received. If the data is successfully read or decoded, the controller 102 may be configured to associate the data with a destination block using the relocation buffer 403 or 404, as shown in FIG. 4. The relocation buffer 403 may be associated with the destination block 405 and the relocation buffer 404 may be associated with the destination block 406. The controller 102 may be configured to issue or transfer data write operations to non-volatile memory device 118 for data associated with the relocation buffer 403 to be stored in the destination block 405, and for data associated with relocation buffer 404 to be stored in the destination block 406.

If the controller 102 determines that the received data is successfully read or decoded by the encode/decode engine 104 using the first read-level voltage, then the controller may be configured to determine the destination blocks with the least amount of available storage space or the greatest amount of occupancy level and associate the data with that destination block. The controller 102 may be configured to associate the data with the corresponding relocation buffer of that destination block, as shown in FIG. 4. Additional details of the relocation of data is described below with reference to FIG. 5.

Figure 5:
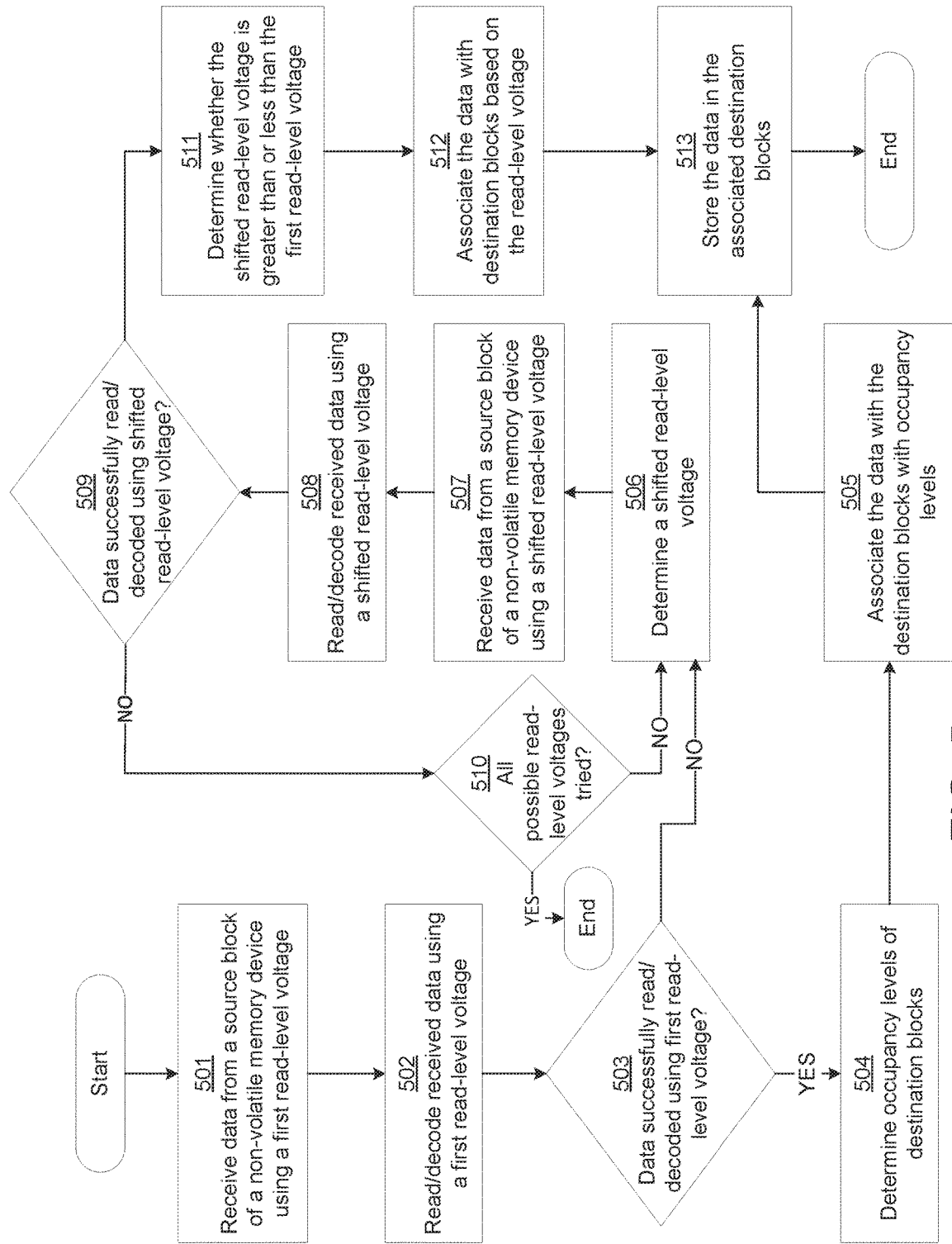
FIG. 5 is a flow chart of an example method of determining whether a wordline satisfies a true erase condition according to illustrative implementations.

Turning now to FIG. 5, there is shown a flowchart illustrating a process of data relocation based on error recovery result. For the purpose of illustrating a clear example, components of the data storage system 100 shown and described with reference to FIGS. 2 and 3 will be used to describe the process of data relocation based on error recovery result. The process of data relocation based on error recovery result may be initiated in response to a data relocation operation, such as, but not limited to, a garbage collection operation of the data storage system 100. The method 500 includes receiving (by a controller of a data storage system, such as the controller 102 of the data storage system 100) data from a source block, such as a source block 305, of non-volatile memory device 118 using a first read-level voltage (block 501). Data may be received from a source block 305 of the non-volatile memory device 118 in response to a read operation performed on the source block. Data may be read from the source block via a read operation.

In some implementations, a read operation is performed by applying the first read-level voltage to a wordline of the source datablock. Such a first read-level voltage may be a predetermined read-level voltage or a voltage calculated due to one or more operating conditions of the data storage system. For example, such a read-level voltage may be calculated based on the wear-level of the non-volatile memory device, such as a number of program-erase cycles associated with the non-volatile memory device. In some implementations, a number of read-level voltages may be predetermined and the controller 102 or the internal non-volatile memory controller 122 may be configured to apply one of the predetermined read-level voltages based on various factors of the non-volatile memory device 118. For example, the controller 102 or the internal non-volatile memory controller 122 may be configured to apply a certain predetermined read-level voltage based on the program-erase cycle count of the non-volatile memory device 118.

In some implementations, data read from the source block of the non-volatile memory device may be stored in a data storage unit coupled to the encode/decode engine 104. The data read from the source block may be encoded. In some implementations, the controller 102, via the processor 103, for example, may be configured to provide an identifier for each read operation requested by the controller. The identifier may be an identifier of a buffer storage space in a data storage unit coupled to the controller 102 or included in the controller 102. For example the data storage unit may be coupled to processor 103 of the controller 102.

The controller 102, via the encode/decode engine 104, for example, attempts to read the received data using the first read-level voltage (block 502). The encode/decode engine 104 may attempt to read the received data by decoding the encoded data or codeword. The encode/decode engine 104 may be configured to decode the received data using the first read-level voltage applied in reading that data from the source block. The controller 102, via the encode/decode engine 104, may determine whether the received data was successfully read or decoded using the first read-level voltage (block 503). In some implementations, successfully reading the received data may include successfully decoding received encoded data. If the encode/decode engine 104 successfully reads and/or decodes the data by applying the first voltage, then the controller 102, via the processor 103, determines occupancy levels of the destination blocks, such as the destination blocks 405, 406, at which the successfully read data may be stored (block 504). The processor 103 may be configured to select a destination block for storing the data, based on the available space in or occupancy level of the destination blocks. In some implementations, the processor 103 may be configured to determine available storage space or occupancy level of each of the destination blocks based on data relevant to indicating the available storage space or free space of the destination blocks. In some implementations, the processor 103 may be provided data related to the available storage space or occupancy levels of all the destination blocks at the beginning of the data relocation process and may be configured to maintain and/or update data related to the available storage space or occupancy levels of the destination blocks after data is stored in the destination blocks. For example, after each data write operation command issued during the data relocation process, the processor 103 may update the available data storage space of the destination block at which the data is stored.

The controller 102, via the processor 103, associates the data with the destination blocks based on the occupancy levels of the destination blocks (block 505). The processor 103 may be configured to associate the data with the destination block with the least amount of available storage space or largest occupancy level of the destination blocks. The processor 103 may associate the data with a destination block by associating an identifier of the data, such as the buffer identifier of the data, with a relocation buffer, such as the relocation buffers 403, 404. In some implementations, the processor 103 may be configured to store the buffer identifier of the data in a relocation buffer associated with the destination block. For example, the processor 103 may determine that a destination block 306 has the greatest occupancy level or least available storage space and associates the data with the destination block 406 by storing the buffer identifier in the relocation buffer 404, the relocation buffer associated with the destination block 306. The controller 102, via the processor 103, causes the data to be stored in the associated destination block (block 513). For example, the processor 103 may be configured to issue or transfer a write data operation or command to the non-volatile memory device 118, and transfer the data to the non-volatile memory device 118 to be stored in destination block. The processor 103 may be configured to specify the destination block when issuing or transferring the write data operation or command to the non-volatile memory device 118. Additional details of the block 513 are described below. By associating or selecting the destination block by the least amount of available storage space or occupancy levels, the controller 102, via the processor 103, causes the data to be stored in that destination block and that destination block to be filled and closed, thus reducing the number of open memory blocks in the data storage system 100. Reduction of the number of open memory blocks reduces probability of errors occurring in stored data and improves bit error rate associated with the stored data and/or bit error rate of the non-volatile memory. Improving the bit error rate, improves the performance and efficiency of the data storage system in performing various data operations. For example, improving bit error rate reduces the number of errors affecting retrieved data, thus, reducing the number of processor cycles required to successfully read and/or decode data and improving performance and efficiency of data storage system.

Returning to block 503, if the controller 102, via the encode/decode engine 104, does not successfully read or decode the data by applying the first voltage, then the controller 102, via the encode/decode engine 104, determines a shifted read-level voltage (block 506). The shifted read-level voltage is a read-level voltage that may be greater than or less than the first read-level voltage. In some implementations, the encode/decode engine 104 may be configured to determine shifted read-level voltages based on a voltage shift pattern. In some implementations, a voltage shift pattern may be a list of shifted read-level voltages and/or a list of offset amounts. The encode/decode engine 104 may be configured to maintain and/or track a series or number of shifted read-level voltages. For example, the encode/decode engine 104 may maintain and/or update a counter that indicates the number of times the read-level voltage is shifted. The encode/decode engine 104 may be configured to determine a new shifted read-level voltage and/or the amount of voltage by which to shift a read-level voltage, for example, the first read-level voltage, based on such a counter. The encode/decode engine 104 may be configured to utilize a mapping between read-level voltages and counter values, or offsets or shift amounts and counter values to determine a new shifted read-level voltage and/or the amount of voltage by which to shift a read-level voltage.

The controller 102 may be configured to issue a read operation command using the shifted read-level voltage. For example, the encode/decode engine 104 may first increase the read-level voltage by a threshold amount and data may be re-read from the source block using the increased read-level voltage. Similarly, the encode/decode engine 104 may first decrease the read-level voltage by a threshold amount and data may be re-read from the source block using the decreased read-level voltage. In response to the read operation performed using the shifted read-level voltage, the controller receives data from the source block that was retrieved or read using the shifted read-level voltage (block 507). The controller 102, via the encode/decode engine 104, for example, may be configured to read or successfully decode the received data using the shifted read-level voltage (block 508).

The controller 102, via the encode/decode engine 104, for example, determines whether the data was successfully read or decoded using the shifted read-level voltage (block 509). If the controller 102, via the encode/decode engine 104, determines that the received data is not successfully read or decoded using the shifted read-level voltage (NO' at block 509), then the process proceeds to block 510 to determine whether all possible read-level voltages have been applied to read or decode the received data. In some implementations, the controller 102 may be configured to apply a predetermined number of read-level voltages to received data. In some implementations, the controller 102 may be configured to generate and/or update a counter value that indicates a number of read-level voltages applied to received data and determine whether all possible read-level voltages have been applied to the received data by determining whether the number of read-level voltages applied to received data, indicated by the counter, satisfies a predetermined number of read-level voltages. In some implementations, the controller 102 may be configured to apply a set or a range of read-level voltages, for example, read-level voltages between 1.2 volts and 1.5 volts, and determine whether all possible read-level voltage have been applied to read or decode the received data based on whether each read-level voltage within the set or the range of the read-level voltages is applied to read or decode the received data. In some implementations, the controller 102 may be configured to store each read-level voltage applied to read or decode the received data in a storage unit and determine whether each read-level voltage within the set or the range of the read-level voltages is applied based on the read-level voltages stored in the storage unit and read-level voltages within the set or the range of read-level voltages. For example, the controller 102 may be configured to compare the read-level voltages applied and/or stored in the storage unit with the read-level voltages in the set or the range of read-level voltages, and determine that all possible read level voltages are applied if every read-level voltage in the set or the range of read-level voltages is applied and/or stored in the storage unit.

If the controller 102, via the encode/decode engine 104, determines that all possible read-level voltages are not applied (NO' at block 510), then the process proceeds to block 506, to determine a new shifted read-level voltage. In implementations where the encode/decode engine 104 is configured to determine shifted read-level voltages based on a voltage shift pattern, the new shifted read-level voltages may be determined based on the voltage shift pattern. In implementations where the encode/decode engine 104 is configured to determine shifted read-level voltages based on a counter that indicates the number of times the read-level voltage is shifted. If the controller 102, via the encode/decode engine 104, determines that all possible read-level voltages have been applied (YES' at block 510), then the process terminates.

If the controller 102, via the encode/decode engine 104, successfully reads or decodes the received data using the shifted read-level voltage (YES' at block 509), then the controller 102, via the processor 103, determines whether the shifted read-level voltage used to successfully read and/or decode the data is greater than or less than the first read-level voltage (block 511). The controller 102, via the processor 103, associates the received data or the decoded data with a destination block, such as a destination block 405, 406 (block 512). If the controller 102, via the processor 103, determines that the shifted read-level voltage was greater than the first read-level voltage, then the controller 102, via the processor 103, may be configured to associate the data with a destination block that has a program-erase (P/E) cycle count below or equal to a certain threshold P/E count. If the controller 102, via the processor 103, determines that the shifted read-level voltage was less than the first read-level voltage, then the controller 102, via the processor 103, may be configured to associate the data with a destination block that has a P/E cycle count above or equal to a certain threshold P/E count. The controller 102, via the processor 103, may be configured to associate the data with a destination block by associating the data with a relocation buffer, such as the relocation buffers 403, 404.

In some implementations, the controller 102, via the processor 103, may be configured to associate received data with destination blocks by associating an identifier of the received data with a relocation buffer associated with the destination blocks. For example, as shown in FIG. 4, relocation buffer 403 is associated with destination blocks 405, and relocation buffer 404 is associated with destination blocks 406. The controller 102 may be configured to associate the received data or an identifier of received data with a relocation buffer by storing the identifier of the received data in one of the relocation buffers. For example, if the received data was successfully read and/or decoded using a shifted read-level voltage that is greater than the first read-level voltage, then the controller 102, via the processor 103, may associate the received data and/or identifier of the received data with the relocation buffer associated with the destination blocks that have a low P/E cycle count, such as the relocation buffer 404 associated with the destination blocks 406. Similarly, if the received data was successfully read and/or decoded using a shifted read-level voltage that is less than the first read-level voltage, then the controller, via the processor, may associate the received data and/or identifier of the received data with the relocation buffer associated with the destination blocks that have a high P/E cycle count, such as the relocation buffer 403 associated with the destination blocks 405.

The controller 102, via the processor 103, cause the data to be stored in the associated destination blocks (block 513). The controller 102, via the processor 103, may be configured to cause the received data associated with a destination block to be stored in the destination block by issuing a write data operation or command to the non-volatile memory that includes the destination blocks. The controller 102, via the processor 103, may be configured to cause the received data associated with a relocation buffer to be stored in the associated destination blocks. The controller 102, via the processor 103, may be configured to cause the received data associated with a relocation buffer to be stored in the associated destination blocks by issuing a write data operation or command to the non-volatile memory that includes the destination blocks. In some implementations, the controller 102, via the processor 103, may be configured to cause the received data to be stored in the destination blocks if the amount of received data or the amount of data associated with the relocation buffer satisfies a threshold amount of data. For example, if the amount of data associated with the relocation buffer satisfies 96 KB of data or a physical page of date, then the controller, via the processor, may cause the data associated with the buffer to be stored in the destination block by issuing or transferring a write data operation to the non-volatile memory device.

The blocks of the flowchart illustrated in FIG. 5 have been described as occurring sequentially. The subject technology is not limited to the described sequential performance of the illustrated process. One or more of the blocks may be performed in parallel with other blocks in the illustrated process. Other variations in the illustrated process are within the scope of the subject technology.

In one or more implementations, a source region may refer to a source block. In one or more examples, a source block may refer to one or more source blocks. A source block may be referred to as a source memory block. In one or more implementations, a destination region may refer to a destination block. In one or more examples, a destination block may refer to one or more destination blocks. A destination block may be referred to as a destination memory block. In one or more implementations, a data retention recovery may refer to a process of a recovery of data by shifting or adjusting a read-level voltage to be less than a center read-level voltage or a default read-level voltage or a pre-determined read-level voltage. In one or more implementations, a disturb error recovery may refer to a process of a recovery of data by shifting or adjusting a read-level voltage to be greater than a center read-level voltage or a default read-level voltage or a pre-determined read-level voltage.

Various examples of aspects of the disclosure are described below. These are provided as examples, and do not limit the subject technology.

In one or more implementations, a data storage system includes a non-volatile memory device including a source region and a destination region, where the destination region includes a first destination block and a second destination block, where the second destination block is different from the first destination block, and a controller. The controller is configured to read first data in the source region using a first read-level voltage. The controller is configured to read second data in the source region using a second read-level voltage that is different from the first read-level voltage. The controller is configured to associate, based on the first and second read-level voltages, each of the first data and the second data with a respective one of the first and the second destination blocks. The controller is configured to cause each of the first and second data to be stored in the associated one of the first and second destination blocks.

In one or more implementations, a computer-implemented method includes reading first data in a source region of a non-volatile memory device using a first read-level voltage. The method includes reading second data in the source region using a second read-level voltage that is different from the first read-level voltage. The method includes storing the first data from the source region to a first destination block of the non-volatile memory device associated with the first read-level voltage, where the first destination block is in a destination region of the non-volatile memory device. The method includes storing the second data from the source region to a second destination block of the non-volatile memory device associated with the second read-level voltage, where the second destination block is in the destination region of the non-volatile memory device.

In one or more implementations, a data storage system includes a non-volatile memory device including a source region and a destination region, where the destination region includes a first destination block and a second destination block, where the second destination block is different from the first destination block. The data storage system includes a means for reading first data in the source region using a first read-level voltage. The data storage system includes a means for reading second data in the source region using a second read-level voltage that is different from the first read-level voltage. The data storage system includes a means for relocating the first and the second data from the source region to the first or the second destination block based on the first and the second read-level voltages.

In one or more implementations, a non-transitory machine-readable medium includes machine-executable instructions thereon that, when executed by a processor, perform a method. The method includes reading first data in a source region of a non-volatile memory device using a first read-level voltage. The method includes reading second data in the source region using a second read-level voltage that is different from the first read-level voltage. The method includes storing the first data from the source region to a first destination block of the non-volatile memory device associated with the first read-level voltage, where the first destination block is in a destination region of the non-volatile memory device. The method includes storing the second data from the source region to a second destination block of the non-volatile memory device associated with the second read-level voltage, where the second destination block is in the destination region of the non-volatile memory device.

It is understood that other configurations of the subject technology will become readily apparent to those skilled in the art from the detailed description herein, wherein various configurations of the subject technology are shown and described by way of illustration. The subject technology is capable of other and different configurations and its several details are capable of modification in various other respects, all without departing from the scope of the subject technology. Accordingly, the drawings and detailed description are to be regarded as illustrative in nature and not as restrictive.

Many of the above-described features of example process and related features and applications, may be implemented as software or firmware processes that are specified as a set of instructions recorded on a processor-readable storage medium (also referred to as computer-readable medium). When these instructions are executed by one or more processing unit(s) (e.g., one or more processors, cores of processors, or other processing units), the processing unit(s) are caused to perform the actions indicated in the instructions. Examples of processor-readable media include, but are not limited to, volatile memory, non-volatile memory, as well as other forms of media such as magnetic media, optical media, and electronic media. The processor-readable media does not include carrier waves and electronic signals communicated wirelessly or over wired connections.

The term "software" is meant to include, where appropriate, firmware residing in memory or applications stored in memory, which may be read into a working memory for processing by a processor. Also, in some implementations, multiple software aspects of the subject disclosure may be implemented as sub-parts of a larger program while remaining distinct software aspects of the subject disclosure. In some implementations, multiple software aspects may also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) may be written in any form of programming language, including compiled or interpreted languages, declarative or procedural languages, and it may be deployed in any form, including as a standalone program or as a module, component, subroutine, object, or other unit suitable for use in a computing environment. A computer program may, but need not, correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code).

It is understood that illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject disclosure.

It is understood that the specific order or hierarchy of steps in the processes disclosed is presented as an illustration of some exemplary approaches. Based upon design preferences and/or other considerations, it is understood that the specific order or hierarchy of steps in the processes may be rearranged. For example, in some implementations some of the steps may be performed simultaneously. Thus the accompanying method claims present elements of the various steps in a sample order, and are not meant to be limited to the specific order or hierarchy presented.

The previous description is provided to enable any person skilled in the art to practice the various aspects described herein. The previous description provides various examples of the subject disclosure, and the subject disclosure is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code may be construed as a processor programmed to execute code or operable to execute code.

The phrases "in communication with" and "coupled" mean in direct communication with or in indirect communication with via one or more components named or unnamed herein (e.g., a memory card reader)

A phrase such as an "aspect" does not imply that such aspect is essential to the subject disclosure or that such aspect applies to all configurations of the subject disclosure. A disclosure relating to an aspect may apply to all configurations, or one or more configurations. An aspect may provide one or more examples. A phrase such as an aspect may refer to one or more aspects and vice versa. A phrase such as an "implementation" does not imply that such implementation is essential to the subject disclosure or that such implementation applies to all configurations of the subject disclosure. A disclosure relating to an implementation may apply to all aspects, or one or more aspects. An implementation may provide one or more examples. A phrase such as an "implementation" may refer to one or more implementations and vice versa. A phrase such as a "configuration" does not imply that such configuration is essential to the subject disclosure or that such configuration applies to all configurations of the subject disclosure. A disclosure relating to a configuration may apply to all configurations, or one or more configurations. A configuration may provide one or more examples. A phrase such as a "configuration" may refer to one or more configurations and vice versa.

The word "exemplary" is used to mean "serving as an example or illustration." Any aspect or design described herein as "exemplary" is not necessarily to be construed as preferred or advantageous over other aspects or designs.

What is claimed is:

1. A data storage system, comprising:
   a non-volatile memory device including a source region and a destination region,
      wherein the source region is different from the destination region,
      wherein the destination region includes memory blocks that are logically grouped into destination blocks,
      wherein the destination blocks include a first destination block and a second destination block,
      wherein the second destination block is different from the first destination block,
      wherein the first destination block has a first program-erase cycle count,
      wherein the second destination block has a second program-erase cycle count that is different from the first program-erase cycle count,
      wherein a first read-level voltage is specifically designated to the first destination block prior to reading first data,
      wherein a second read-level voltage is specifically designated to the second destination block prior to reading second data,
      wherein the second read-level voltage is different from the first read-level voltage,
      wherein the first read-level voltage requires each data in the source region, successfully read using the first read-level voltage, to be relocated to the first destination block as designated by the first read-level voltage,
      wherein the second read-level voltage requires each data in the source region, successfully read using the second read-level voltage, to be relocated to the second destination block as designated by the second read-level voltage,
      wherein a third read-level voltage is different from each of the first and second read-level voltages,
      wherein the third read-level voltage requires each data in the source region successfully read using the third read-level voltage to be relocated to one of the first and second destination blocks, depending on occupancy levels of buffers associated with the first and second destination blocks, and
      wherein the buffers comprise a first buffer and a second buffer; and
   a controller, wherein the controller is configured to:
      successfully read the first data in the source region using the first read-level voltage;
      successfully read the second data in the source region using the second read-level voltage;
      associate, as required by the first and second read-level voltages, each of the first data and the second data with a respective one of the first and the second destination blocks;
      cause each of the first and second data to be relocated from the source region to the associated one of the first and second destination blocks, as required by the respective first and second read-level voltages;
      successfully read third data in the source region using the third read-level voltage;
      in response to successfully reading the third data using the third read-level voltage:
         determine an occupancy level of the first buffer associated with the first destination block;
         determine an occupancy level of the second buffer associated with the second destination block;
         determine, as required by the occupancy levels of the first and second buffers, to relocate the third data to the one of the first and second destination blocks; and
         cause the third data to be relocated from the source region to the one of the first and second destination blocks, as required by the occupancy levels of the first and second buffers,
      wherein when a data is not successfully read using the third read-level voltage, the controller does not determine nor use the occupancy levels of the first and second buffers for relocating the data,
      wherein when the first data is successfully read using the first read-level voltage, the controller does not determine nor use the occupancy levels of the first and second buffers for relocating the first data, and
      wherein when the second data is successfully read using the second read-level voltage, the controller does not determine nor use the occupancy levels of the first and second buffers for relocating the second data.

2. The data storage system of claim 1, wherein the first read-level voltage is less than the second read-level voltage, and wherein each of the first and second read-level voltages is associated with error recovery.

3. The data storage system of claim 1, wherein the third read-level voltage is less than the second read-level voltage and greater than the first read-level voltage.

4. The data storage system of claim 1,
   wherein the non-volatile memory device includes the first buffer associated with the first destination block and the second buffer associated with the second destination block, and
   wherein the controller is configured to relocate the third data from the source region to one of the first and second buffers, wherein the one of the first and second buffers has a smaller amount of unoccupied data space than the other one of the first and second buffers.

5. The data storage system of claim 1,
   wherein the source region includes logical pages, and wherein one of the logical pages includes a plurality of code words,
   wherein the controller is configured to:
      read a first one of the plurality of code words using the third read-level voltage;
      read a second one of the plurality of code words using a fourth read-level voltage that is different from the third read-level voltage; and relocate the first and second ones of the plurality of code words to a same one of the first and second destination blocks based on occupancy levels of the first and second buffers.

6. The data storage system of claim 1,
wherein the first data comprises a first code word,
wherein the controller configured to successfully read the first data comprises the controller configured to:
  apply a fourth read-level voltage to perform a first decoding operation on the first code word, wherein the fourth read-level voltage is less than the second read-level voltage and greater than the first read-level voltage;
  determine that the first code word is unsuccessfully decoded using the fourth read-level voltage; and
  in response to determining that the first code word is unsuccessfully decoded:
    determine the first read-level voltage;
    apply the first read-level voltage to perform a second decoding operation on the first code word; and
    successfully decode the first code word using the first read-level voltage.

7. A computer-implemented method for a data storage system, comprising:
  logically grouping memory blocks of a destination region of a non-volatile memory device into destination blocks,
    wherein the destination blocks include a first destination block and a second destination block,
    wherein the second destination block is different from the first destination block,
    wherein the first destination block has a first program-erase cycle count,
    wherein the second destination block has a second program-erase cycle count that is different from the first program-erase cycle count,
    wherein a first read-level voltage is specifically designated to the first destination block,
    wherein a second read-level voltage is specifically designated to the second destination block,
    wherein the second read-level voltage is different from the first read-level voltage,
    wherein the first read-level voltage requires each data in a source region, successfully read using the first read-level voltage, to be moved to the first destination block as designated by the first read-level voltage,
    wherein the second read-level voltage requires each data in the source region, successfully read using the second read-level voltage, to be moved to the second destination block as designated by the second read-level voltage,
    wherein a third read-level voltage is different from each of the first and second read-level voltages,
    wherein the third read-level voltage requires each data in the source region successfully read using the third read-level voltage to be relocated to one of the first and second destination blocks, depending on occupancy levels of buffers associated with the first and second destination blocks, and
    wherein the buffers comprise a first buffer and a second buffer;
  successfully reading first data from a first location of the source region of the non-volatile memory device using the first read-level voltage;
  successfully reading second data from a second location of the source region using the second read-level voltage;
  moving the first data from the first location of the source region to the first destination block of the non-volatile memory device as designated by the first read-level voltage;
  moving the second data from the second location of the source region to the second destination block of the non-volatile memory device as designated by the second read-level voltage,
  successfully reading third data in the source region using the third read-level voltage;
  in response to successfully reading the third data using the third read-level voltage:
    determining an occupancy level of the first buffer associated with the first destination block;
    determining an occupancy level of the second buffer associated with the second destination block;
    determining, as required by the occupancy levels of the first and second buffers, to relocate the third data to the one of the first and second destination blocks; and
    causing the third data to be relocated from the source region to the one of the first and second destination blocks, as required by the occupancy levels of the first and second buffers,
  wherein when a data is not successfully read using the third read-level voltage, a controller does not determine nor use the occupancy levels of the first and second buffers for relocating the data,
  wherein when the first data is successfully read using the first read-level voltage, the controller does not determine nor use the occupancy levels of the first and second buffers for relocating the first data, and
  wherein when the second data is successfully read using the second read-level voltage, the controller does not determine nor use the occupancy levels of the first and second buffers for relocating the second data.

8. The computer-implemented method of claim 7, wherein the first read-level voltage is less than the second read-level voltage, wherein the first read-level voltage is associated with data retention error recovery, and wherein the second read-level voltage is associated with read disturb error recovery.

9. The computer-implemented method of claim 7, wherein the third read-level voltage is less than the second read-level voltage and greater than the first read-level voltage.

10. The computer-implemented method of claim 7, further comprising:
  reading a first one of a plurality of code words using the third read-level voltage, wherein the plurality of code words are included in one of a logical pages included in the source region;
  reading a second one of the plurality of code words using a fourth read-level voltage that is different from the third read-level voltage; and
  storing the first and second ones of the plurality of code words to a same one of the first and second destination blocks, based on occupancy levels of the first and second buffers associated with the first and second destination blocks.

11. The computer-implemented method of claim 10, wherein the first data comprises a first code word, and wherein successfully reading the first data comprises:

determining that the first code word is unsuccessfully decoded using the third read-level voltage; and successfully decoding the first code word using the first read-level voltage, wherein the first read-level voltage is less than the third read-level voltage.

12. A data storage system, comprising:

a non-volatile memory device including a source region and a destination region,
  wherein the source region is different from the destination region,
  wherein the destination region includes memory blocks that are logically grouped into destination blocks,
  wherein the destination blocks include a first destination block and a second destination block,
  wherein the second destination block is different from the first destination block,
  wherein the first destination block has a first program-erase cycle count,
  wherein the second destination block has a second program-erase cycle count that is different from the first program-erase cycle count,
  wherein a first read-level voltage is specifically designated to the first destination block,
  wherein a second read-level voltage is specifically designated to the second destination block,
  wherein the second read-level voltage is different from the first read-level voltage,
  wherein the first read-level voltage requires each data in the source region, successfully read using the first read-level voltage, to be relocated to in the first destination block as designated by the first read-level voltage,
  wherein the second read-level voltage requires each data, in the source region successfully read using the second read-level voltage, to be relocated to the second destination block as designated by the second read-level voltage,
  wherein a third read-level voltage is different from each of the first and second read-level voltages,
  wherein the third read-level voltage requires each data in the source region successfully read using the third read-level voltage to be relocated to one of the first and second destination blocks, depending on occupancy levels of buffers associated with the first and second destination blocks, and
  wherein the buffers comprise a first buffer and a second buffer;

means for successfully reading first data from a first location of the source region using the first read-level voltage;

means for successfully reading second data from a second location of the source region using the second read-level voltage; and means for relocating the first and the second data from the source region to the first or the second destination block as required by the first and the second read-level voltages;

means for successfully reading third data in the source region using the third read-level voltage;

in response to successfully reading the third data using the third read-level voltage:
  means for determining an occupancy level of the first buffer associated with the first destination block;
  means for determining an occupancy level of the second buffer associated with the second destination block;
  means for determining, as required by the occupancy levels of the first and second buffers, to relocate the third data to the one of the first and second destination blocks; and
  means for causing the third data to be relocated from the source region to the one of the first and second destination blocks, as required by the occupancy levels of the first and second buffers, wherein when a data is not successfully read using the third read-level voltage, a controller does not determine nor use the occupancy levels of the first and second buffers for relocating the data, wherein when the first data is successfully read using the first read-level voltage, the controller does not determine nor use the occupancy levels of the first and second buffers for relocating the first data, and wherein when the second data is successfully read using the second read-level voltage, the controller does not determine nor use the occupancy levels of the first and second buffers for relocating the second data.

13. The data storage system of claim 1,
wherein the memory blocks are logically grouped into the destination blocks predetermined based on program-erase cycle counts,
wherein the program-erase cycle counts include the first program-erase cycle count and the second program-erase cycle count, and
wherein the first program-erase cycle count of the first destination block is higher than the second program-erase cycle count of the second destination block.

14. The data storage system of claim 1,
wherein the first program-erase cycle count of the first destination block is higher than the second program-erase cycle count of the second destination block, and
wherein the first read-level voltage associated with the first destination block is less than the second read-level voltage associated with the second destination block.

15. The data storage system of claim 14,
wherein when the first data is successfully read using the first read-level voltage assigned to the first destination block, the controller is configured to cause moving the first data into the first destination block, and
wherein when the second data is successfully read using the second read-level voltage assigned to the second destination block, the controller is configured to cause moving the second data into the second destination block.

16. The data storage system of claim 1,
wherein the third read-level voltage is a read-level voltage determined based on a program-erase cycle count of the non-volatile memory device,
wherein the first read-level voltage is specifically designated to the first destination block prior to reading the first data, and
wherein the second read-level voltage is specifically designated to the second destination block prior to reading the second data.

* * * * *